(12) United States Patent
Mori et al.

(10) Patent No.: US 6,651,023 B2
(45) Date of Patent: Nov. 18, 2003

(54) SEMICONDUCTOR TEST APPARATUS, AND METHOD OF TESTING SEMICONDUCTOR DEVICE

(75) Inventors: Hisaya Mori, Hyogo (JP); Shinji Yamada, Hyogo (JP); Teruhiko Funakura, Tokyo (JP)

(73) Assignees: Mitsubishi Denki Kabushiki Kaisha, Tokyo (JP); Ryoden Semiconductor System Engineering Corporation, Hyogo (JP)

(*) Notice: Subject to any disclaimer, the term of this patent is extended or adjusted under 35 U.S.C. 154(b) by 136 days.

(21) Appl. No.: 09/927,367

(22) Filed: Aug. 13, 2001

(65) Prior Publication Data

US 2002/0106817 A1 Aug. 8, 2002

(30) Foreign Application Priority Data

Feb. 8, 2001 (JP) .................................... 2001-032852

(51) Int. Cl.⁷ .............................................. G06F 13/00
(52) U.S. Cl. ..................... 702/117; 702/108; 702/121; 702/123
(58) Field of Search ................ 702/57, 69, 74, 702/108, 117, 121, 123, 127, 163; 324/765; 709/200; 704/230; 438/600, 5.1, 14, 17

(56) References Cited

U.S. PATENT DOCUMENTS 5,884,023 A * 3/1999 Swoboda et al. ...... 395/183.06
5,909,186 A * 6/1999 Gohringer ................... 341/120
6,320,528 B1 * 11/2001 Michel ......................... 341/144
6,331,770 B1 * 12/2001 Sugamori ................... 324/158.1
6,498,998 B1 * 12/2002 Furukawa ................... 702/117

FOREIGN PATENT DOCUMENTS

JP          8-233912          9/1996
JP          9-189750          7/1997

OTHER PUBLICATIONS

Co-pending Related U.S. patent application Ser. No. 09/904,625, filed Jul. 16, 2001 (Our Ref. No. 50090-312).

* cited by examiner

Primary Examiner—Marc S. Hoff
Assistant Examiner—Felix Suarez
(74) Attorney, Agent, or Firm—McDermott, Will & Emery

(57) ABSTRACT

A semiconductor test apparatus includes an analog-to-digital converter for converting into a digital signal an analog output from a circuit under test; a test-apparatus-ADC-control-signal generation circuit for generating a control signal for the analog-to-digital converter in accordance with an activation signal entered from the outside; a measured data memory for storing, as measured data for each conversion, a signal output from the analog-to-digital converter; an address counter for generating an address signal for the measured data memory; a DAC counter for generating data to be input to the circuit under test; and a data write control circuit which produces, in response to a flag signal output from the analog-to-digital converter and representing that conversion is being performed, an update signal for the address counter, a memory write signal for the measured data memory, and an update signal for the DAC counter.

11 Claims, 7 Drawing Sheets

SEMICONDUCTOR TEST APPARATUS, AND METHOD OF TESTING SEMICONDUCTOR DEVICE

BACKGROUND OF THE INVENTION

1. Field of the Invention

The present invention relates to a semiconductor test apparatus for testing an analog circuit (e.g., an analog-to-digital converter or a digital-to-analog converter) which is one of LSIs to be tested (hereinafter called "DUTs") by an LSI test apparatus (hereinafter called "tester"), as well as to a method of testing a semiconductor device using the semiconductor test apparatus.

2. Background Art

Recently, in relation to a system LSI (embodied in a one-chip LSI consisting of a plurality of functionally-systematized circuit modules or embodied in a chip set LSI), combination of digital and analog circuits (i.e., a system LSI handling a mixed signal), having high-performance and precision, has been rapidly pursued. In order to cope with such a tendency, tester manufacturers have provided testers compatible with a semiconductor integrated circuit using a mixed signal. A tester compatible with a semiconductor integrated circuit using a mixed signal has high performance specifications and inevitably becomes expensive. For this reason, one proposed resolution is recycling an existing low-speed, low-precision tester (e.g., a tester for a logic LSI), to thereby avoid a hike in the price of a tester.

A big problem with such a test apparatus lies in a characteristic test for a converter circuit for converting a digital signal into an analog signal (digital-to-analog converter, hereinafter called a "DAC") as well as in a characteristic test for a converter circuit for converting an analog signal into a digital signal (hereinafter called an "ADC"). In a testing environment of a general tester, connection jigs for connecting a tester with a DUT, such as a plurality of DUT circuit boards (simply called "DUT boards") and cables, are provided at a plurality of points along a measurement path extending from measurement equipment provided in the tester to a DUT. Further, the measurement path is long and accounts for occurrence of noise and a drop in measurement accuracy. A limitation is imposed on the speed of a low-speed tester, and hence the low-speed tester cannot conduct a test at a real operating speed, thereby posing a fear of an increase in a time required for conducting mass-production testing of a system LSI.

FIG. 7 is a block diagram showing a BOST device of a related-art semiconductor test apparatus which has been conceived for shortening a test time according to a method of testing a DAC of a DUT and which employs a technique for conducting a test through use of an external ADC disposed in the vicinity of a DUT.

As shown in the drawing, reference numeral 1 designates a tester; 2 designates a DUT; 3 designates a digital-to-analog converter section of the DUT 2; 4 designates an output section of the DUT 2; 5 designates a CPU of the DUT 2; 6 designates an analog-to-digital converter section; 7 designates a digital signal entered by way of the tester 1; 8 designates an analog signal produced through digital-to-analog conversion; 9 designates a digital signal produced through analog-to-digital conversion; 10 designates a CPU of the tester 1; 11 designates RAM; 12 designates a signal for controlling input/output operations of the RAM 11; and 13 designates a digital signal output from the RAM 11.

The operation of the BOST device will now be described.

The digital signal 7 entered by way of the tester 1 is converted into an analog signal by means of the digital-to-analog converter section 3 of the DUT 2. The thus-converted signal is further subjected to analog-to-digital conversion in the analog-to-digital converter 6, and the thus-converted data are stored in the RAM 11. After all these operations have been performed, the data stored in the RAM 11 are output. The thus-output data and the data input to the digital-to-analog converter section 3 of the DUT 2 are compared by the tester 1, thus making an evaluation of the DAC.

FIG. 8 is a block diagram showing a BOST device of a related-art semiconductor test apparatus which has been conceived for shortening a test time according to a method of testing an ADC of a DUT and which employs a technique for conducting a test through use of an external DAC disposed in the vicinity of a DUT. In FIG. 8, elements which are identical with those shown in FIG. 7 are assigned the same reference numerals, and repeated explanations thereof are omitted.

As shown in FIG. 8, reference numeral 14 designates a digital-to-analog converter; 15 designates a DUT; 16 designates an analog-to-digital converter section of the DUT 15; 17 designates an output section of the DUT 15; and 18 designates a CPU of the DUT 15.

The operation of the BOST device will now be described.

The digital signal 7 entered by way of the tester 1 is subjected to digital-to-analog conversion in the digital-to-analog converter 14, and the thus-converted signal is further subjected to analog-to-digital conversion in the analog-to-digital conversion section 16 of the DUT 15. Further the thus-converted data are stored in the RAM 11. After all these operations have been performed, the data stored in the RAM 11 are output. The thus-output data and the data input to the digital-to-analog converter 14 are compared by the tester 1, thus making an evaluation of the ADC.

The related-art semiconductor test apparatus shown in FIG. 7 suffers the following problems.

All data, addresses, and control signals stored in measured data storage memory; i.e., RAM, connected to an external ADC; i.e., an analog-to-digital converter, must be supplied from a tester [a CPU and a timing pattern generator (TPG)]. The majority of pin electronics provided on a tester are occupied for testing a single ADC, thus imposing limitations on simultaneous measurement of a plurality of ADCs. Test results are evaluated after all tests have been completed. Hence, an effect of shortening a time required for effecting a real test is small. Further, measured data must be uploaded to a CPU of the tester, thus resulting in a chance of an increase arising in a processing time including communications time. Further, the related-art semiconductor test apparatus has failed to describe a control method and procedures and is devoid of specificity of a method of shortening a test time.

The related-art semiconductor test apparatus shown in FIG. 8 suffers the same problem as that encountered by the related-art test apparatus shown in FIG. 7.

SUMMARY OF THE INVENTION

The present invention has been conceived to solve the problems set forth and is aimed at providing a semiconductor test apparatus which is susceptible of simultaneously measuring a plurality of DUTs, enables shortening of a real test time, and obviates a necessity for uploading measured data to a CPU of the tester, as well as providing a method of testing a semiconductor device using the semiconductor test apparatus.

According to one aspect of the present invention, a semiconductor test apparatus comprises an analog-to-digital converter for converting into a digital signal an analog output from a circuit under test. Further the apparatus comprises a test-apparatus-ADC-control-signal generation circuit for generating a control signal for the analog-to-digital converter in accordance with an activation signal from the outside or the inside. Further the apparatus comprises a measured data memory for storing, as measured data for each conversion, a signal output from the analog-to-digital converter. Further the apparatus comprises an address counter for generating an address signal for the measured data memory. Further the apparatus comprises a DAC counter for generating data to be input to the circuit under test. Further the apparatus comprises a data write control circuit which produces, in response to a flag signal output from the analog-to-digital converter and representing that conversion is being performed, an update signal for the address counter, a memory write signal for the measured data memory, and an update signal for the DAC counter.

According to another aspect of the present invention, a semiconductor test apparatus comprises digital-to-analog converter for producing an analog input to a circuit under test. Further the apparatus comprises a measured data memory for storing, as measured data for each conversion, a signal which has been output from the circuit under test and has been subjected to analog-to-digital conversion. Further the apparatus comprises an address counter for generating an address signal for the measured data memory. Further the apparatus comprises a DAC counter for generating data to be input to the digital-to-analog converter. Further the apparatus comprises a data write control circuit for producing, in response to a flag signal which is output from the circuit under test and represents that conversion is being performed, an update signal for the address counter, a memory write signal for the measured data memory, and an update signal for the DAC counter.

According to another aspect of the present invention, a semiconductor test apparatus comprises an analog-to-digital converter for converting into a digital signal an analog output from a circuit under test. Further the apparatus comprises a digital-to-analog converter for producing an analog input to be sent to the circuit under test. Further the apparatus comprises a measured data memory for storing, as measured data for each conversion, a signal output from the analog-to-digital converter and a signal which has been output from the circuit under test and has been subjected to analog-to-digital conversion. Further the apparatus comprises an address counter for generating an address signal for the measured data memory. Further the apparatus comprises a DAC counter for producing data to be input to the circuit under test and to the digital-to-analog converter. Further the apparatus comprises a data write control circuit for producing, in response to a flag signal which has been output from the analog-to-digital converter and from the circuit under test and which represents that conversion is being performed, an update signal for the address counter, a memory write signal for the measured data memory, and an update signal for the DAC counter. Further the apparatus comprises a digital signal processor analysis section for reading measured data from the measured data memory and computing a characteristic parameter pertaining to the circuit under test, thus evaluating predetermined specifications.

Other and further objects, features and advantages of the invention will appear more fully from the following description.

DETAILED DESCRIPTION OF THE PREFERRED EMBODIMENTS

Embodiments of the present invention will be described by reference to the accompanying drawings.

First Embodiment

Figure 1:
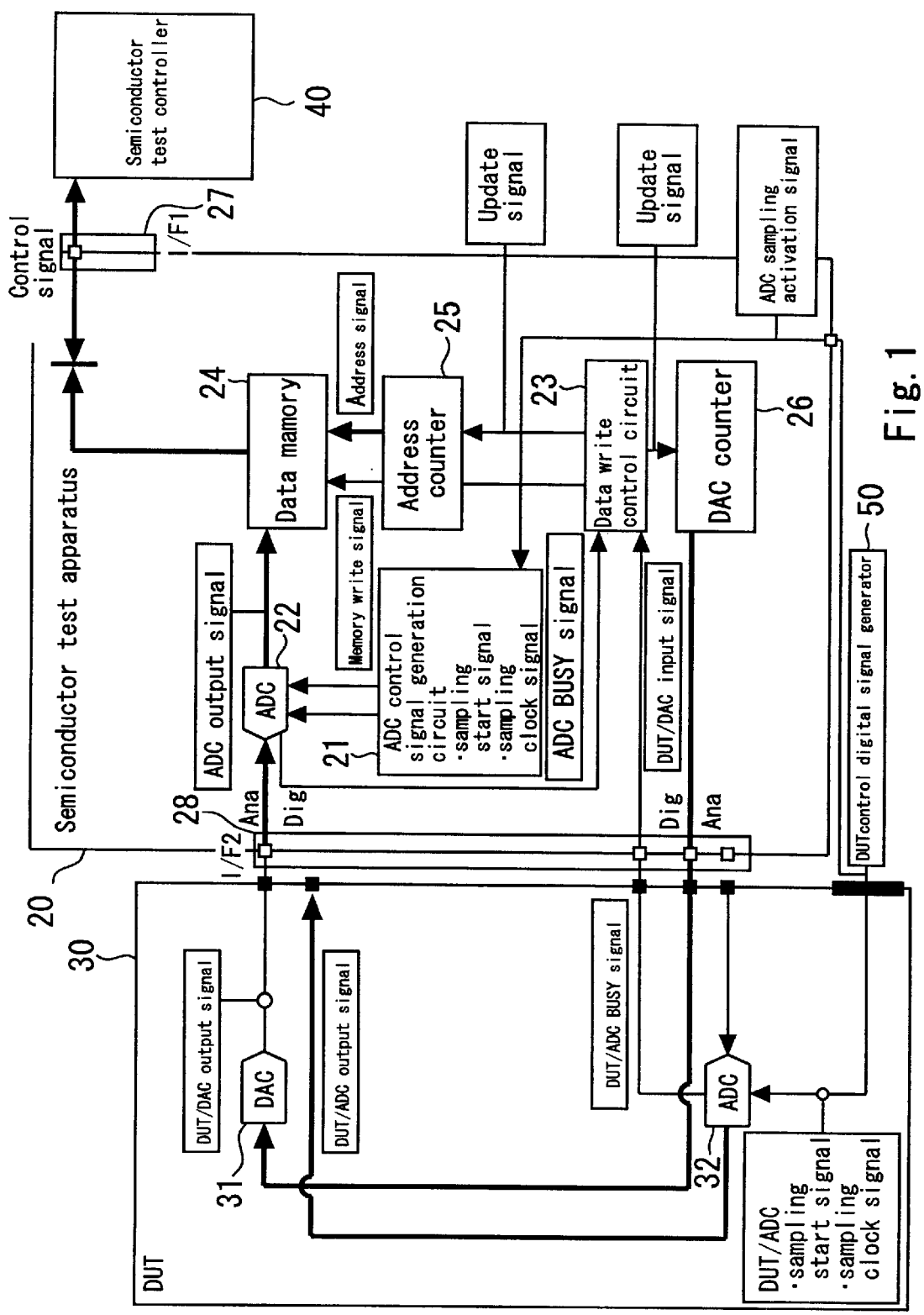
FIG. 1 is a block diagram showing a semiconductor test apparatus according to a first embodiment of the present invention.

FIG. 1 is a block diagram showing a semiconductor test apparatus according to a first embodiment of the present invention.

As shown in the drawing, reference numeral 20 designates a semiconductor test apparatus; and 21 designates a test-apparatus-ADC-control-signal generation circuit which acts as control signal generation means. From a test apparatus ADC sampling activation signal output from a DUT control digital signal generator 50 serving as digital signal generation means, the test-apparatus-ADC-control-signal generation circuit 21 produces a sampling start signal and a sampling clock signal, which act as control signals for the test apparatus ADC.

Reference numeral 22 designates an analog-to-digital converter (ADC) which converts an analog output from the digital-to-analog converter (DAC) 31 built in a DUT 30 serving as a circuit under test and which acts as analog-to-digital conversion means. Reference numeral 23 designates a data write control circuit which acts as data write control means. In response to a BUSY (flag representing that conversion is being performed) output from the analog-to-digital converter 22, the data write control circuit 23 produces an update signal for an address counter 25 which serves as address signal generation means for generating an address of measured data memory 24 serving as storage means. The data write control circuit 23 further produces a memory write signal for the measured data memory 24 and an update signal for a DAC counter 26 serving as input data generation means.

The measured data memory 24 stores, for each conversion, measured data which serve as a signal output from the analog-to-digital converter 22. The address counter 25 produces an address signal for the measured data memory 24. Further, the DAC counter 26 produces a digital code to be entered into a built-in DAC of a DUT.

Reference numeral 27 designates an I/F provided for a semiconductor test controller 40; and 28 designates an I/F provided for a DUT (semiconductor integrated circuit) 30 to be described later.

The DUT 30 comprises a digital-to-analog converter 31 and an analog-to-digital converter 32. The digital-to-analog converter 31 converts a digital signal output from the DAC counter 26 into an analog signal and supplies the analog signal to the analog-to-digital converter 22 by way of the I/F 28. A DUT/ADC sampling start signal and a sampling clock signal, which are output from a DUT control digital signal generator 50, are input to the analog-to-digital converter 32. The analog-to-digital converter 32 converts an external analog signal into a digital signal and outputs the result as a DUT/ADC signal.

The semiconductor test controller 40 and the DUT control digital signal generator 50 may be provided in the semiconductor test apparatus 20.

Figure 2:
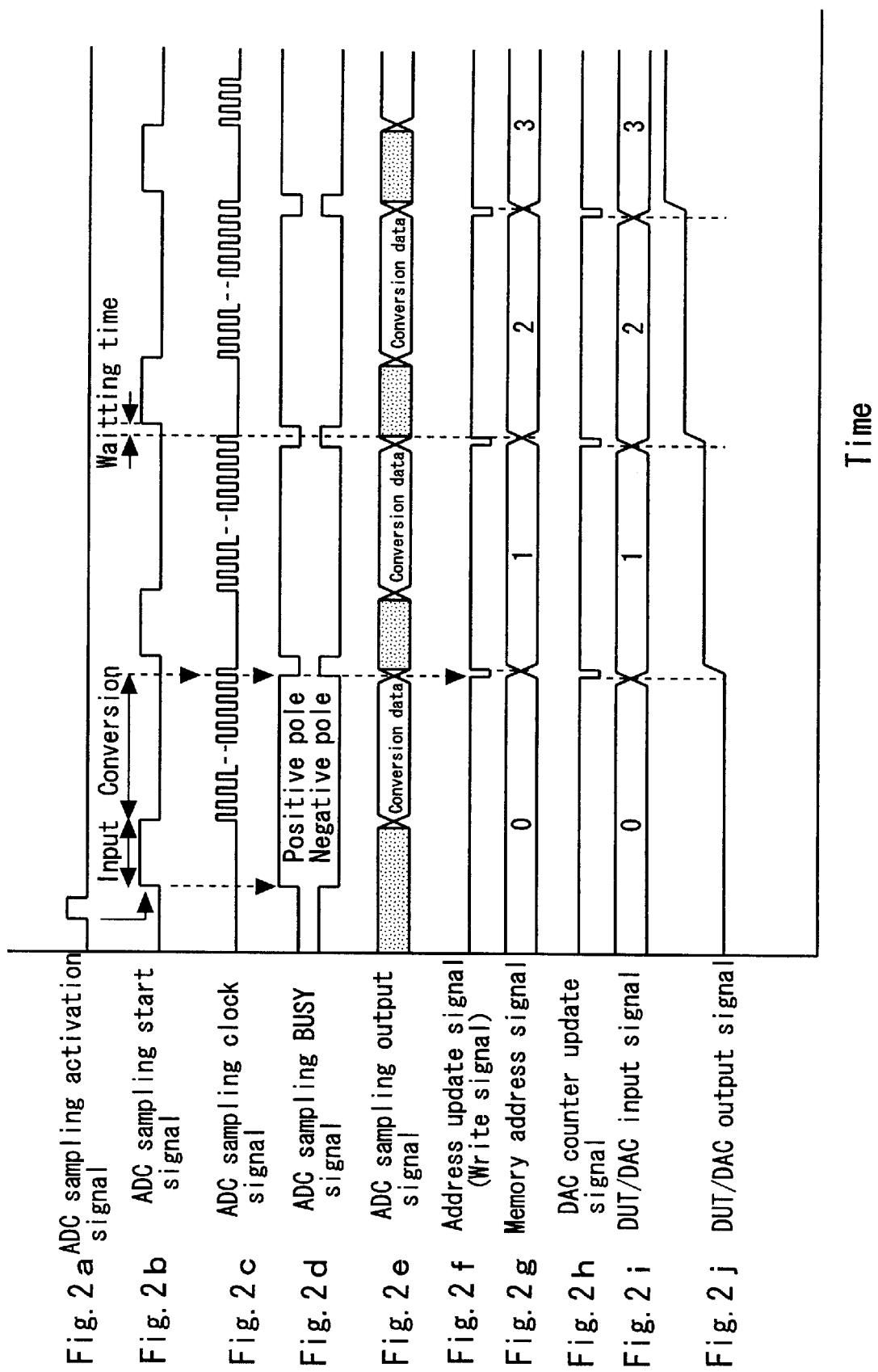
FIGS. 2a through 2j are timing charts showing the operation of the semiconductor test apparatus according to the first embodiment.

The operation of the semiconductor test apparatus will now be described by reference to FIG. 2.

The DAC counter 26 supplies a DUT/DAC input signal (FIG. 2i); that is, a digital code, to the digital-to-analog converter 31 built in the DUT 30. An analog output from the digital-to-analog converter 31 is supplied to the analog-to-digital converter 22. The resultantly-converted data (i.e., a result of measurement) are written into the measured data memory 24. A sampling start signal (FIG. 2b) and a sampling clock signal (FIG. 2c), which are to be sent to the analog-to-digital converter 22 at this time, are produced by the test-apparatus-ADC-control-signal generation circuit 21 in response to a sampling activation signal (FIG. 2a) from the DUT control digital signal generator 50. Further, a signal to be written into the measured data memory 24 (see FIG. 2f) is produced by the data write control section 23 in response to a test apparatus ADC conversion BUSY signal (showing that conversion is being performed) (FIG. 2d).

Next, the address counter 25 of the measured data memory 24 is incremented. An address update signal (FIG. 2f) employed at this time is produced by the data write control section 23 in response to the test apparatus ADC conversion BUSY signal. The DAC counter 26 is updated to the next code, thereby changing the DUT/DAC output signal (FIG. 2j). The DAC counter update signal (FIG. 2h) is produced by the data write control section 23 in response to the test apparatus ADC conversion BUSY signal. Subsequently, the above-described operations are iterated until the DUT/DAC input becomes a final code set in the DAC counter 26 (or in the address counter 25).

As mentioned above, in the present embodiment, a DAC built in a DUT can be measured, through use of only a sampling activation signal output from a general DUT control digital signal generator. The digital code is automatically changed by means of hardware of the test apparatus. The DAC can be measured in the minimum period of time without involvement of a wait time which would be induced by software processing.

Second Embodiment

In the first embodiment, measurement speed of a built-in DAC of the DUT is increased. In the present embodiment, an ADC-built-in-DUT sampling start signal and a sampling clock signal, which are output from a general DUT control digital signal generator, are employed, thereby outputting to outside the DUT a BUSY signal representing the start of conversion operation and performance of a conversion operation. Thus, measurement of an ADC built in a DUT is speeded up.

Figure 3:
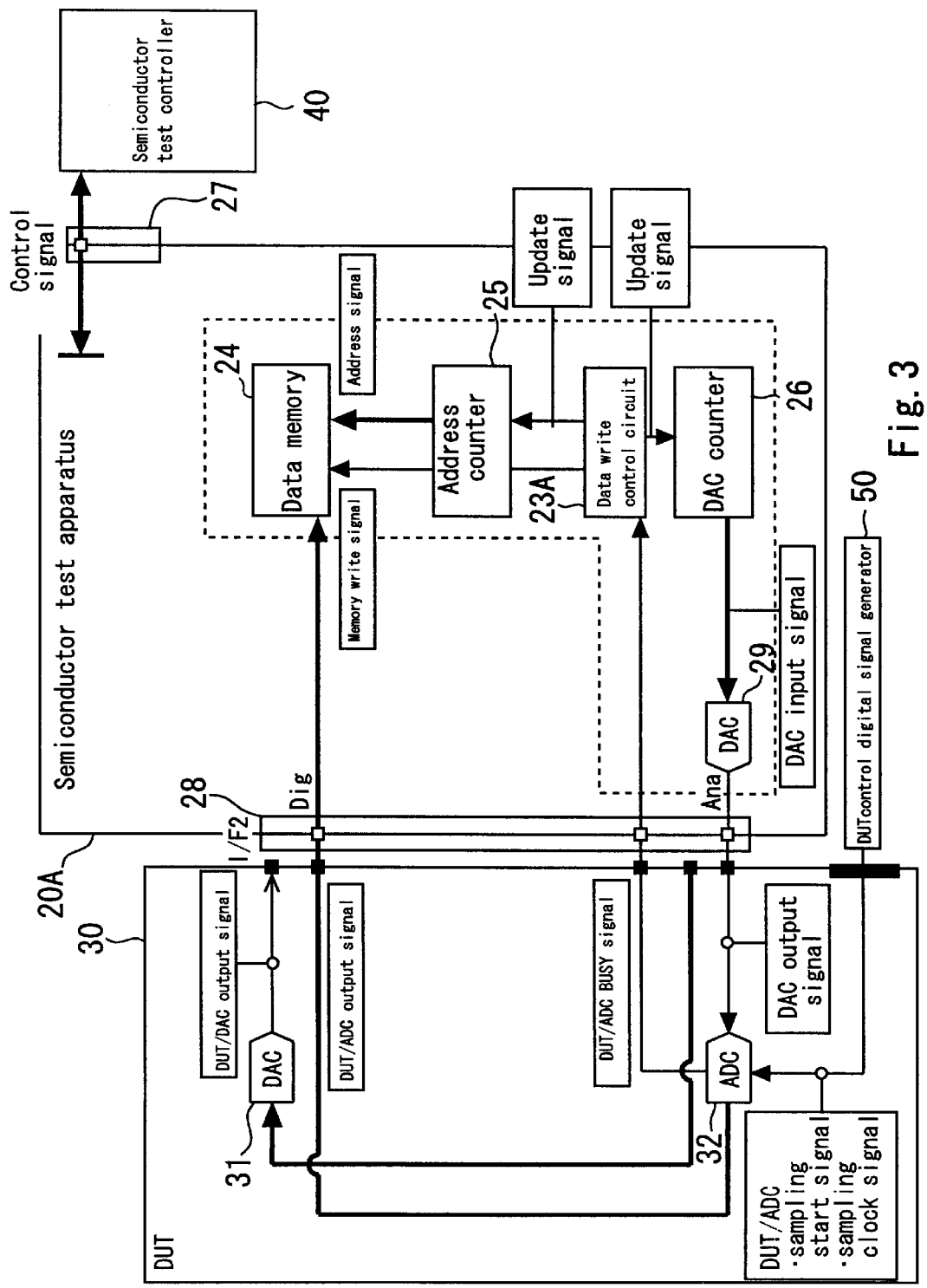
FIG. 3 is a block diagram showing a semiconductor test apparatus according to a second embodiment of the present invention.

FIG. 3 is a block diagram showing a semiconductor test apparatus according to a second embodiment of the present invention. In FIG. 3, elements which are identical with those shown in FIG. 1 are assigned the same reference numerals, and repetition of detailed explanations thereof is omitted.

In the drawing, reference numeral 20A designates a semiconductor test apparatus; and 23A designates a data write control circuit. The data write control circuit 23A serves as data write control means. In response to a BUSY signal (i.e., a flag showing that conversion is being performed) output from the analog-to-digital converter (ADC) 32 built in the DUT 30, the data write control circuit 23A produces an update signal for the address counter 25 of the measured data memory 24, a memory write signal for the measured data memory 24, and an update signal for the DAC counter 26.

Reference numeral 29 designates a digital-to-analog converter serving as digital-to-analog conversion means. The digital-to-analog converter 29 converts a test apparatus DAC input signal output from the DAC counter 26 into an analog signal to be input to the analog-to-digital converter (ADC) 32 built in the DUT 30. A DUT/ADC output signal produced by the analog-to-digital converter (ADC) 32 is supplied to the measured data memory 24 as measured data. In other respects, the semiconductor test apparatus is identical with that shown in FIG. 1, except that the test apparatus ADC control signal generation circuit 21 and the analog-to-digital converter 22 are omitted from the semiconductor test apparatus 20A.

Figure 4:
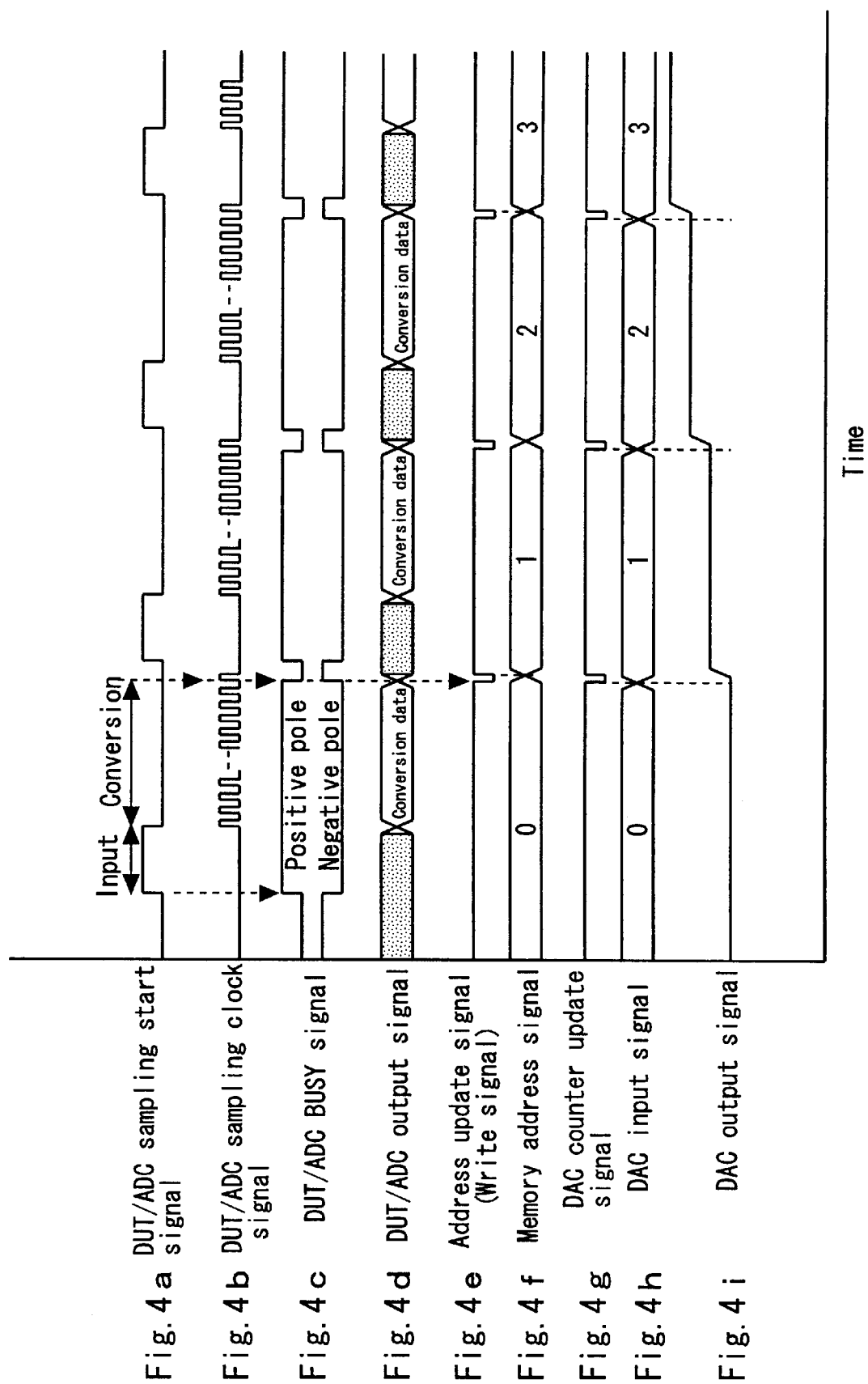
FIGS. 4a through 4i are timing charts showing the operation of the semiconductor test apparatus according to the second embodiment.

The operation of the semiconductor test apparatus will be described by reference to FIG. 4.

A test apparatus DAC input signal (FIG. 4h); that is, a digital code, is supplied from the DAC counter 26 to the digital-to-analog converter 29. An analog signal output from the digital-to-analog converter 29 is input to the analog-to-digital converter 32 built in the DUT 30. The resultantly-converted data (i.e. a result of measurement) are written into the measured data memory 24. A sampling start signal (FIG. 4a) and a sampling clock signal (4b), which are sent to the analog-to-digital converter 32 at this time, are produced by the DUT control digital signal generator 50. A write signal (FIG. 4e) to be written into the measured data memory 24 is produced by the data write control section 23 in response to a DUT/ADC conversion BUSY signal (FIG. 4c) (i.e., a flag showing that conversion is being performed).

The address counter 25 of the measured data memory 24 is incremented. An address update signal (FIG. 4e) employed at this time is produced by the data write control section 23 in response to a DUT/ADC conversion BUSY signal. The DAC counter 26 is updated to the next code, thereby changing a test apparatus/DAC output signal (FIG. 4i). The DAC counter update signal employed this time (FIG. 4g) is produced by the data write control section 23 in response to the DUT/ADC conversion BUSY signal. These operations are iterated until a DUT/DAC input reaches a final code set in the DAC counter 26 (or address counter 25).

In the present embodiment, an ADC built in a DUT can be measured through use of only a DUT activation signal output from a general DUT control digital signal generator. A digital code is automatically changed by means of hardware of the semiconductor test apparatus, in accordance with an ADC-built-in-DUT conversion BUSY signal. An ADC built in a DUT can be measured in the minimum period of time without involvement of a wait time which would be induced by software processing.

Third Embodiment

In the present embodiment, the analysis operations performed by the semiconductor test apparatus described in the first and second embodiments are speeded up.

Figure 5:
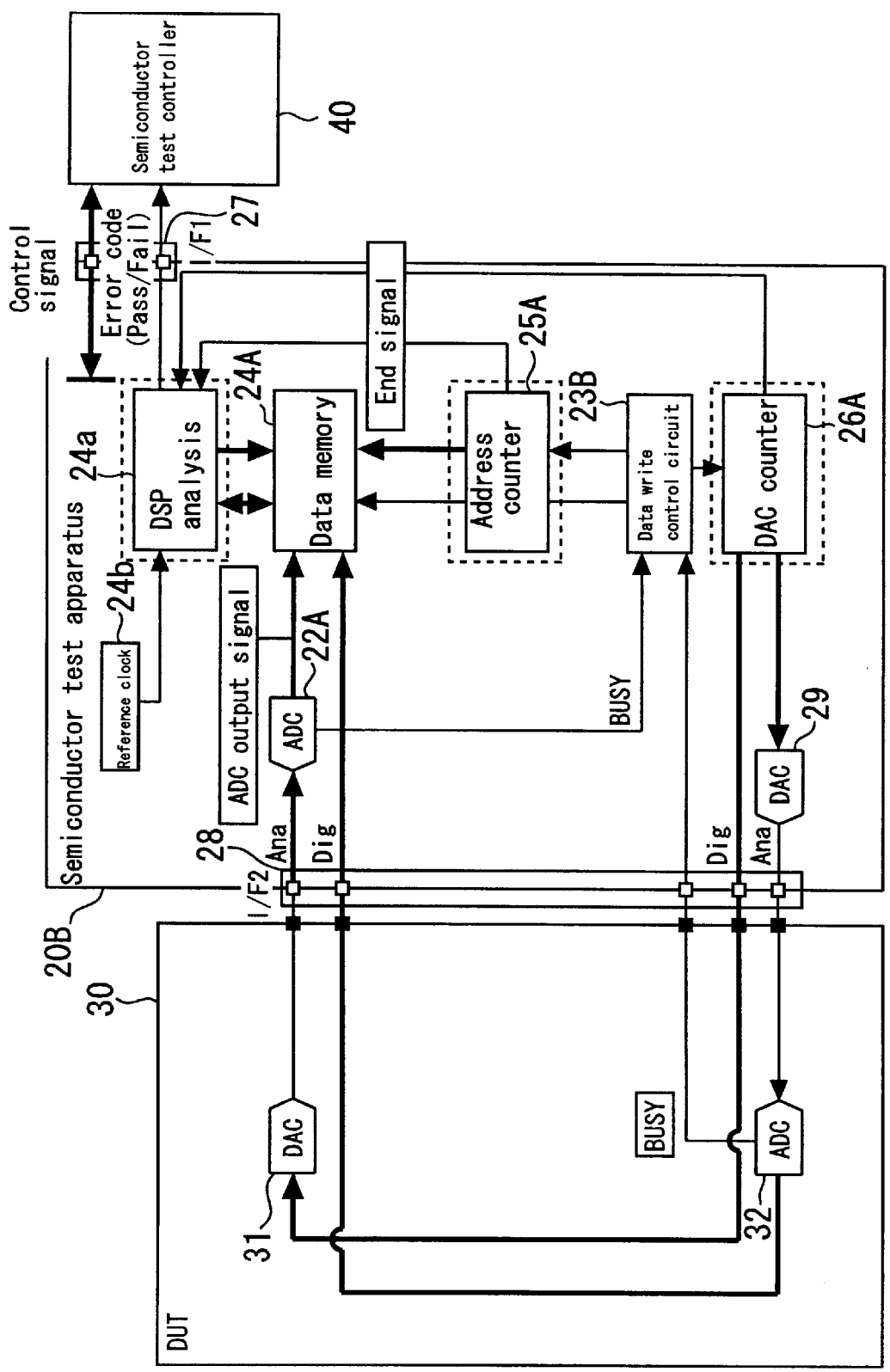
FIG. 5 is a block diagram showing a semiconductor test apparatus according to a third embodiment of the present invention.

FIG. 5 is a block diagram showing a semiconductor test apparatus according to a third embodiment of the present invention. In FIG. 5, elements which are identical with those shown in FIGS. 1 and 3 are assigned the same reference numerals, and repetition of detailed explanations thereof is omitted.

As shown in the drawing, reference numeral 20B designates a semiconductor test apparatus; 22A designates an analog-to-digital converter for converting, into a digital signal, an analog signal output from the digital-to-analog converter 31 built in the DUT 30; and 23B designates a data write control circuit. In response to a BUSY signal (i.e., a flag representing that conversion is being performed) output from the analog-to-digital converter 22A and a BUSY signal (i.e., a flag representing that conversion is being performed) output from the analog-to-digital converter 32 built in the DUT 30, the data write control circuit 23B produces an update signal for the address counter 25A which serves as address signal generation means and is disposed in the measured data memory 24A serving as storage means; a memory write signal for the measured data memory 24A; and an update signal for the DAC counter 26A serving as address signal generation means.

Reference numeral 24a designates a digital signal processor (DSP) analysis section serving as determination means which acquires memory data from the measured data memory 24A and performs arithmetic operation. Reference numeral 24b designates a reference clock signal generator for producing a reference clock signal to be input to the DSP analysis section 24a.

The measured data memory 24A stores, for each conversion, measured data corresponding to a signal output from the analog-to-digital converter 22A. Further, the measured data memory 24A stores, for each conversion, measured data corresponding to a DUT/ADC signal output from the analog-to-digital converter 32. The address counter 25A produces an address signal for the measured data memory 24A and outputs a measurement end signal to the DSP analysis section 24a. The DAC counter 26A produces a DAC-built-in-DUT input digital code and produces a test apparatus/DAC input signal; that is, an input digital code, for the digital-to-analog converter 29. The DAC counter 26A outputs a measurement end signal to the DSP analysis section 24a. In other respects, the semiconductor test apparatus is identical with those shown in FIGS. 1 and 3, except that the test apparatus ADC control signal generation circuit 21 shown in FIG. 1 and the DUT control digital signal generator 50 shown in FIGS. 1 and 3 are omitted from the semiconductor test apparatus 20 shown in FIG. 1 and from the semiconductor test apparatus 20A shown in FIG. 3.

Next will be described the operation of the semiconductor test apparatus according to the present embodiment. Since operations required for acquiring measured data pertaining to a DAC built in a DUT and measured data pertaining to an ADC built in a DUT are the same as those described in connection with the first and second embodiments, their repeated explanations are omitted.

In response to a measurement end signal output from the DAC counter 26A (or address counter 25A) after completion of measurement, the DSP analysis section 24a is activated. The analysis section processor reads measured data from the measured data memory 24A having stored therein the result of measurement of the DAC built in the DUT and the result of measurement of the ADC built in the DUT. The processor computes ADC/DAC characteristics of the DUT, such as a differential linearity and an integral nonlinearity error, thereby evaluating predetermined specifications. An evaluation result (pass/fail) is transmitted to the semiconductor test controller 40 from the semiconductor test apparatus 20B, whereupon a test result is processed.

As mentioned above, in the present embodiment, a high-speed processor which is specifically designed for arithmetic operation and is coupled directly to measured data memory, such as a DSP of an analysis section, can perform immediate analysis of measured data and evaluation of specifications (pass/fail). A necessity of uploading measured data to the semiconductor test controller is obviated, and a communications time is reduced, thus speeding up an analysis operation. Further, analysis can be commenced immediately by means of the measurement end signal. Accordingly, an undesired wait time until analysis is commenced can be curtailed.

When a DAC and an ADC provided in a DUT are to be tested, a DSP analysis section is provided. Even when only a DAC or an ADC of the DUT is to be tested, the DSP analysis section may also be employed.

Fourth Embodiment

A fourth embodiment is a combination of the first through third embodiments, thereby attempting to increase the speed of measurement and analysis.

Figure 6:
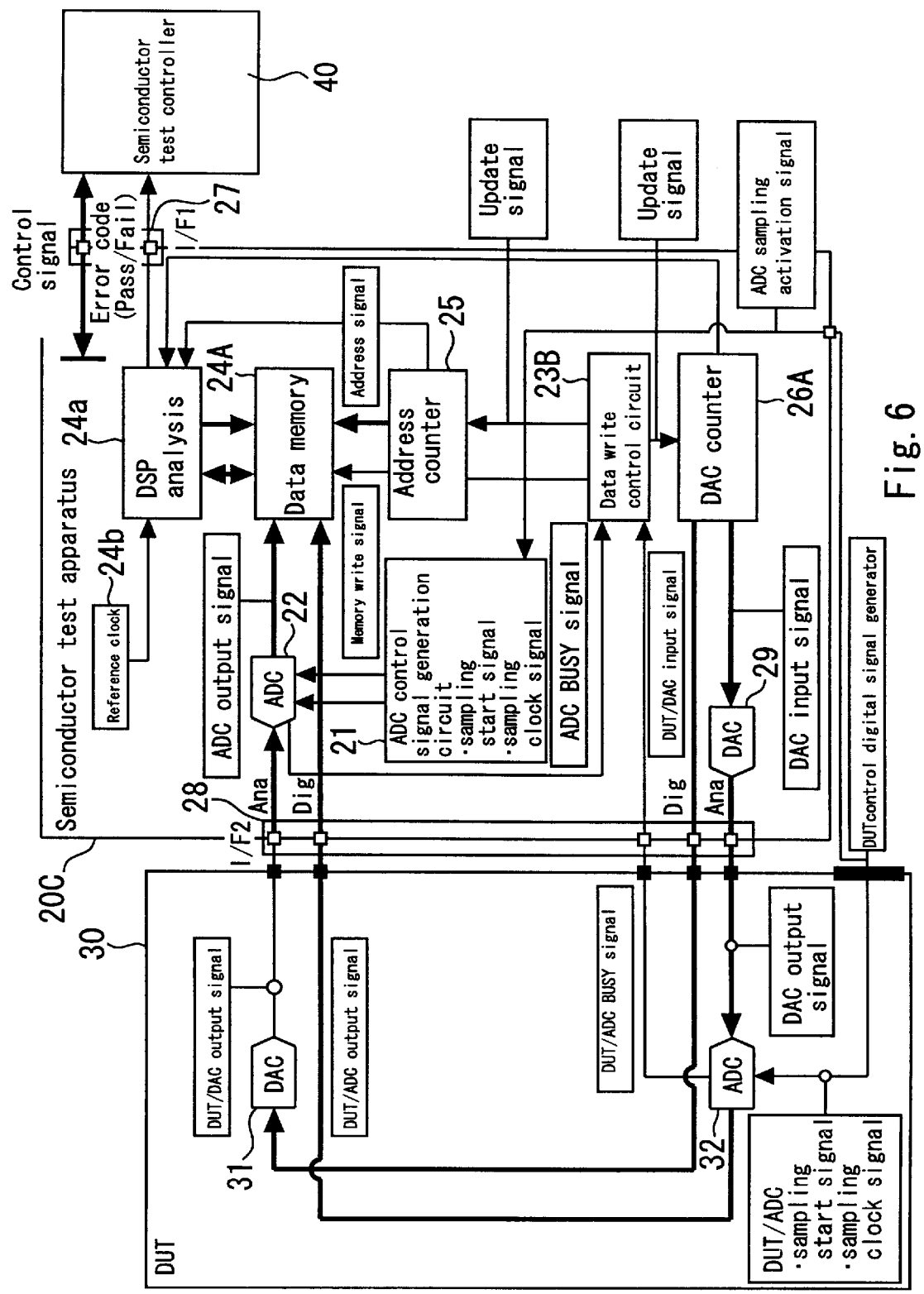
FIG. 6 is a block diagram showing a semiconductor test apparatus according to a fourth embodiment of the present invention.
Figure 7:
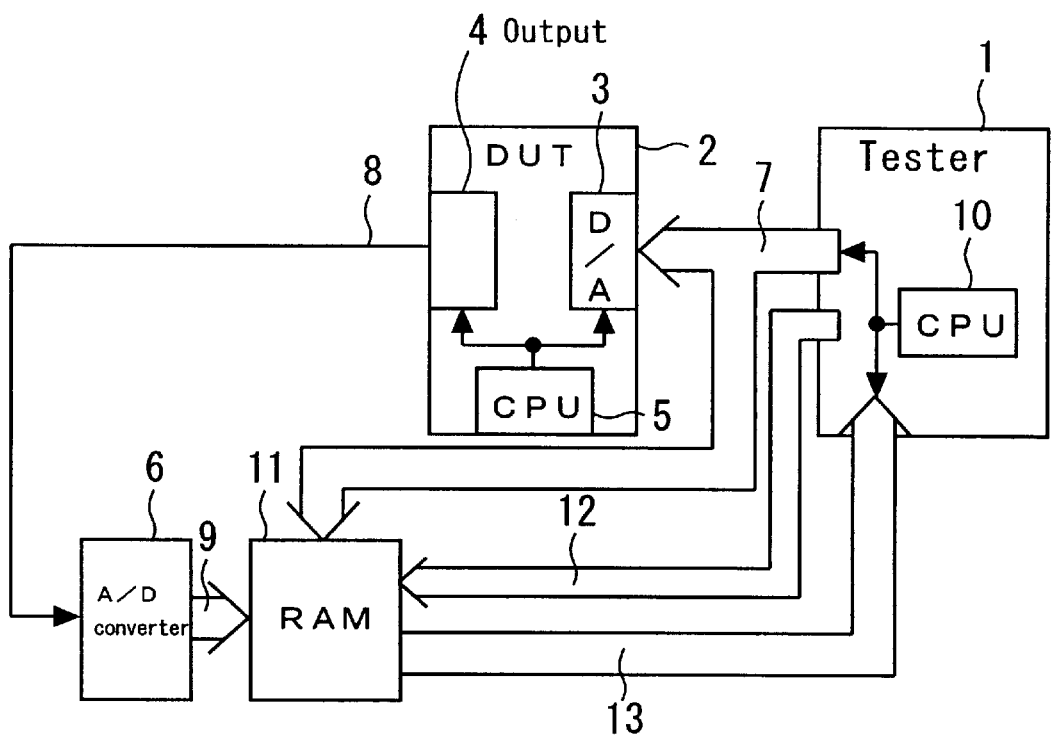
FIG. 7 is a block diagram showing a BOST device of a related-art semiconductor test apparatus.
Figure 8:
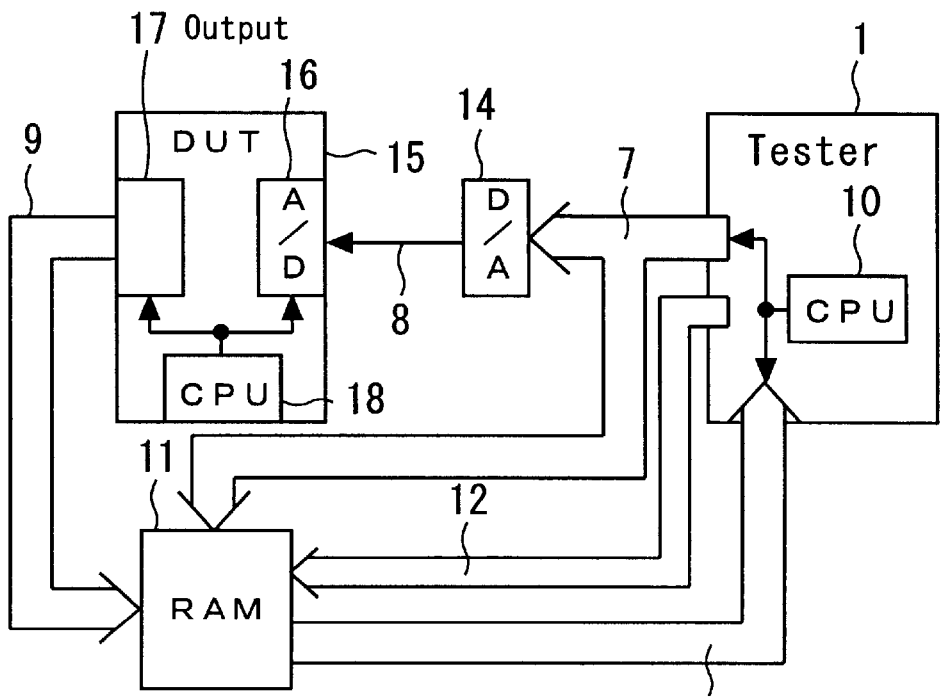
FIG. 8 is a block diagram showing a BOST device of a related-art semiconductor test apparatus

FIG. 6 is a block diagram showing a semiconductor test apparatus according to a fourth embodiment of the present invention. In FIG. 6, elements which are identical with those shown in FIGS. 1, 3, and 5 are assigned the same reference numerals, and repetition of detailed explanations thereof is omitted.

As shown in the drawing, reference numeral 20C designates a semiconductor test apparatus. The semiconductor test apparatus 20C comprises a test apparatus ADC control signal generation circuit 21; an analog-to-digital converter 22; a data write control circuit 23B; measured data memory 24A; an address counter 25 of the measured data memory 24A; a DAC counter 26A; and I/F sections 27 and 28. In other respects, the semiconductor test apparatus is identical with those shown in FIGS. 1, 3, and 5. Since the semiconductor test apparatus is identical in operation with those described in the previous embodiments, repeated explanation thereof is omitted.

As mentioned above, in the present embodiment, a DAC built in a DUT can be measured, through use of only a sampling activation signal output from a general DUT control digital signal generator. A digital code is automatically changed by means of hardware of the test apparatus. The DAC built in a DUT can be measured in the minimum period of time without involvement of a wait time which would be induced by software processing, thus enabling speeding up of measurement of the DAC built in a DUT.

An ADC built in a DUT can be measured through use of only a DUT activation signal output from a general DUT control digital signal generator. A digital code is automatically changed by means of hardware of the test apparatus in accordance with, particularly, an ADC-built-in-DUT conversion BUSY signal. The ADC built in a DUT can be measured in the minimum period of time without involvement of a wait time which would be induced by software processing, thus enabling speeding up of measurement of the ADC built in a DUT.

A high-speed processor which is specifically designed for arithmetic operation and is coupled directly to measured data memory, such as a DSP of an analysis section, can perform immediate analysis of measured data and evaluation of specifications (pass/fail). A necessity of uploading measured data to the semiconductor test controller is obviated, and a communications time is reduced, thus speeding up an analysis operation. Further, analysis can be commenced immediately by means of the measurement end signal. Accordingly, an undesired wait time until analysis is commenced can be curtailed.

The features and advantages of the present invention may be summarized as follows.

According to one aspect, a DAC built in a DUT can be measured, through use of only a sampling activation signal output from a general DUT control digital signal generator. Hence costs can be diminished by means of a reuse or recycle of a low-speed, low-precision existing LSI test apparatus. The present invention enables realization of a system configuration (i.e., application of the semiconductor test apparatus to LSI testers of different types) which does not depend on an LSI tester. As a result, there can be effected facilitation of application of the test apparatus to different types of LSI circuits to be testes, facilitation of quality control (inspection and adjustment) of the LSI tester; improvements in quality of design of an LSI, inexpensive evaluation of LSI design; facilitation of development of the LSI tester to an analysis system; and standardization of a test analysis system (i.e., analysis can be effected through use of a common system from a design process to a mass-production process). Further, there is yielded an advantage of ability to improve analog measurement performance, to speed up an analog characteristic test, and to render the test apparatus compatible with an increase in the speed and precision of an analog characteristic test and with diversification of an analog characteristic test.

According to another aspect, an ADC built in a DUT can be measured through use of only a DUT activation signal output from a general DUT control digital signal generator. Hence costs can be diminished by means of a reuse or recycling of a low-speed, low-precision existing LSI test apparatus. The present invention enables realization of a system configuration (i.e., application of the semiconductor test apparatus to LSI testers of different types) which does not depend on an LSI tester. As a result, there can be effected facilitation of application of the test apparatus to different types of LSI circuits to be tested, facilitation of quality control (inspection and adjustment) of the LSI tester; improvements in quality of design of an LSI, inexpensive evaluation of LSI design; facilitation of development of the LSI tester to an analysis system; and standardization of a test analysis system (i.e., analysis can be effected through use of a common system from a design process to a mass-production process). Further, there is yielded an advantage of ability to improve analog measurement performance, to speed up an analog characteristic test, and to render the test apparatus compatible with an increase in the speed and precision of an analog characteristic test and with diversification of an analog characteristic test.

According to another aspect, a high-speed processor which is specifically designed for arithmetic operation and is coupled directly to measured data memory, such as a DSP of an analysis section, is provided in the apparatus. Hence costs can be diminished by means of a reuse or recycling of a low-speed, low-precision existing LSI test apparatus. The present invention enables realization of a system configuration (i.e., application of the semiconductor test apparatus to LSI testers of different types) which does not depend on an LSI tester. As a result, there can be effected facilitation of application of the test apparatus to different types of LSI circuits to be tested, facilitation of quality control (inspection and adjustment) of the LSI tester; improvements in quality of design of an LSI, inexpensive evaluation of LSI design; facilitation of development of the LSI tester to an analysis system; and standardization of a test analysis system (i.e., analysis can be effected through use of a common system from a design process to a mass-production process). Further, there is yielded an advantage of ability to improve analog measurement performance, to speed up an analog characteristic test, and to render the test apparatus compatible with an increase in the speed and precision of an analog characteristic test and with diversification of an analog characteristic test. There is yielded an advantage of ability to contribute to speeding up of measurement of a DAC and an ADC built in a DUT, and of analysis operation.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-032852, filed on Feb. 8, 2001 including specification, claims, drawings and summary, on which the Convention priority of the present application is based, are incorporated herein by reference in its entirety.

What is claimed is:

1. A semiconductor test apparatus comprising:
   an analog-to-digital converter for converting into a digital signal an analog output from a circuit under test;
   a test-apparatus-ADC-control-signal generation circuit for generating a control signal for the analog-to-digital converter in accordance with an activation signal from the outside or the inside;
   a measured data memory for storing, as measured data for each conversion, a signal output from the analog-to-digital converter;
   an address counter for generating an address signal for the measured data memory;
   a DAC counter for generating data to be input to the circuit under test; and
   a data write control circuit which produces, in response to a flag signal output from the analog-to-digital converter and representing that conversion is being performed, an update signal for the address counter, a memory write signal for the measured data memory, and an update signal for the DAC counter.

2. A semiconductor test apparatus comprising:
   a digital-to-analog converter for producing an analog input to a circuit under test;
   a measured data memory for storing, as measured data for each conversion, a signal which has been output from the circuit under test and has been subjected to analog-to-digital conversion;
   an address counter for generating an address signal for the measured data memory;
   a DAC counter for generating data to be input to the digital-to-analog converter; and
   a data write control circuit for producing, in response to a flag signal which is output from the circuit under test and represents that conversion is being performed, an update signal for the address counter, a memory write signal for the measured data memory, and an update signal for the DAC counter.

3. The semiconductor test apparatus according to claim 2, wherein a DUT control digital signal generator for producing the activation signal is disposed out or in the semiconductor test apparatus.

4. A semiconductor test apparatus comprising:

an analog-to-digital converter for converting into a digital signal an analog output from a circuit under test;

a digital-to-analog converter for producing an analog input to be sent to the circuit under test;

a measured data memory for storing, as measured data for each conversion, a signal output from the analog-to-digital converter and a signal which has been output from the circuit under test and has been subjected to analog-to-digital conversion;

an address counter for generating an address signal for the measured data memory;

a DAC counter for producing data to be input to the circuit under test and to the digital-to-analog converter;

a data write control circuit for producing, in response to a flag signal which has been output from the analog-to-digital converter and from the circuit under test and which represents that conversion is being performed, an update signal for the address counter, a memory write signal for the measured data memory, and an update signal for the DAC counter; and a digital signal processor analysis section for reading measured data from the measured data memory and computing a characteristic parameter pertaining to the circuit under test, thus evaluating predetermined specifications.

5. The semiconductor test apparatus according to claim 4, further comprising a test-apparatus-ADC-control-signal generation circuit for generating a control signal for the analog-to-digital converter, in response to an activation signal from the outside or inside.

6. The semiconductor test apparatus according to claim 4, wherein the digital signal processor analysis section has the function of ability to transmit to a semiconductor controller a result of evaluation of the specifications.

7. The semiconductor test apparatus according to claim 6, wherein the semiconductor controller is incorporated in the semiconductor test apparatus.

8. The semiconductor test apparatus according to claim 4, wherein the characteristic parameter pertaining to the circuit under test corresponds to a characteristic parameter pertaining to an ADC or DAC built in the circuit under test, such as a differential linearity or an integral nonlinearity error.

9. A method of testing a semiconductor device through use of the semiconductor test apparatus defined in claim 1.

10. A method of testing a semiconductor device through use of the semiconductor test apparatus defined in claim 2.

11. A method of testing a semiconductor device through use of the semiconductor test apparatus defined in claim 4.

* * * * *

UNITED STATES PATENT AND TRADEMARK OFFICE
CERTIFICATE OF CORRECTION

PATENT NO. : 6,651,023 B2
DATED : November 18, 2003
INVENTOR(S) : Hisaya Mori et al.

It is certified that error appears in the above-identified patent and that said Letters Patent is hereby corrected as shown below:

<u>Title page,</u>
Item [73], Assignee, change "Mitsubishi Denki Kabushiki Kaisha" to
-- Renesas Technology Corp. --.

Signed and Sealed this

Second Day of March, 2004

JON W. DUDAS
*Acting Director of the United States Patent and Trademark Office*